United States Patent
Happ et al.

(10) Patent No.: US 7,973,384 B2
(45) Date of Patent: Jul. 5, 2011

(54) PHASE CHANGE MEMORY CELL INCLUDING MULTIPLE PHASE CHANGE MATERIAL PORTIONS

(75) Inventors: Thomas Happ, Tarrytown, NY (US); Jan Boris Philipp, Peekskill, NY (US)

(73) Assignee: Qimonda AG, Munich (DE)

( * ) Notice: Subject to any disclaimer, the term of this patent is extended or adjusted under 35 U.S.C. 154(b) by 1286 days.

(21) Appl. No.: 11/265,377

(22) Filed: Nov. 2, 2005

(65) Prior Publication Data

US 2007/0097739 A1    May 3, 2007

(51) Int. Cl.
*H01L 45/00* (2006.01)

(52) U.S. Cl. ........ 257/529; 257/296; 257/528; 257/536; 257/55; 257/63; 257/E45.002

(58) Field of Classification Search ................. 257/751, 257/E45.002; 438/758
See application file for complete search history.

(56) References Cited

U.S. PATENT DOCUMENTS

| | | | |
|---|---|---|---|
| 4,177,475 A | 12/1979 | Holmberg | |
| 6,579,760 B1 * | 6/2003 | Lung | 438/257 |
| 6,674,115 B2 | 1/2004 | Hudgens et al. | |
| 6,838,692 B1 | 1/2005 | Lung | |
| 6,856,002 B2 * | 2/2005 | Moore et al. | 257/529 |
| 6,927,410 B2 | 8/2005 | Chen | |
| 6,946,673 B2 | 9/2005 | Zonca et al. | |
| 7,372,725 B2 * | 5/2008 | Philipp et al. | 365/163 |
| 2003/0137869 A1 * | 7/2003 | Kozicki | 365/158 |
| 2004/0165422 A1 | 8/2004 | Hideki et al. | |
| 2005/0029502 A1 * | 2/2005 | Hudgens | 257/4 |
| 2005/0030800 A1 | 2/2005 | Johnson et al. | |
| 2005/0051901 A1 | 3/2005 | Chen | |
| 2005/0112896 A1 | 5/2005 | Hamann et al. | |
| 2006/0046509 A1 * | 3/2006 | Gwan-Hyeob | 438/758 |

FOREIGN PATENT DOCUMENTS

WO     9707550 A1    2/1997

OTHER PUBLICATIONS

Y.H. Ha et al., "An Edge Contact Type Cell for Phase Change RAM Featuring Very Low Power Consumption", VLSI, 2003.
H. Horii et al., "A Novel Cell Technology Using N-doped GeSbTe Films for Phase Change RAM", VLSI, 2003.
Y.N. Hwang et al., "Full Integration and Reliability Evaluation of Phase-Change RAM Based on 0.24μm-CMOS Technologies", VLSI, 2003.
Y.N. Hwang et al., "Phase-Change Chalcogenide Nonvolatile RAM Completely Based on CMOS Technology", IEEE, 2003.
C.W. Jeong et al., "Switching Current Scaling and Reliability Evaluation in PRAM", NVSMW 2004.
S. Lai, "Current status of the phase change memory and its future", IEDM, 2003.

(Continued)

*Primary Examiner* — Zandra Smith
*Assistant Examiner* — Tsz K Chiu
(74) *Attorney, Agent, or Firm* — Dicke, Billig & Czaja, PLLC

(57) ABSTRACT

A memory cell includes a first electrode, a second electrode, and a first portion of phase-change material contacting the first electrode. The memory cell includes a second portion of phase-change material contacting the second electrode and a third portion of phase-change material between the first portion and the second portion. A phase-change material composition of the third portion and the second portion gradually transitions from the third portion to the second portion.

20 Claims, 6 Drawing Sheets

OTHER PUBLICATIONS

S. Lai et al., "OUM—A 180 nm Nonvolatile Memory Cell Element Technology For Stand Alone and Embedded Applications", IEDM, 2001.

F. Pellizzer et al., "Novel µTrench Phase-Change Memory Cell for Embedded and Stand-Alone Non-Volatile Memory Applications", VLSI 2004.

Frank et al., "DC Conduction in Glasses in the Selenium-Germanium System", Phys. Stat. Sol. (a), 16, pp. 623-632 (1973).

Ling et al., "A Novel Edge Contact Type Cell for Phase Change RAM Using N-doped GeSbTe Films", Solid-State and Integrated Circuits Technology, 2004 Proceedings, vol. 1, pp. 707-710 (Oct. 18, 2004).

* cited by examiner

PHASE CHANGE MEMORY CELL INCLUDING MULTIPLE PHASE CHANGE MATERIAL PORTIONS

CROSS-REFERENCE TO RELATED APPLICATIONS

This application is related to U.S. patent application Ser. No. 11/187,533 entitled "MEMORY DEVICE WITH THERMAL INSULATING LAYERS;" filed Jul. 22, 2005, and is incorporated herein by reference.

BACKGROUND

Phase-change memories include phase-change materials that exhibit at least two different states. Phase-change material may be used in memory cells to store bits of data. The states of phase-change material may be referenced to as amorphous and crystalline states. The states may be distinguished because the amorphous state generally exhibits higher resistivity than does the crystalline state. Generally, the amorphous state involves a more disordered atomic structure, while the crystalline state is an ordered lattice. Some phase-change materials exhibit two crystalline states, e.g. a face-centered cubic (FCC) state and a hexagonal closest packing (HCP) state. These two crystalline states have different resistivities and may be used to store bits of data. In the following description, the amorphous state generally refers to the state having the higher resistivity, and the crystalline state generally refers to the state having the lower resistivity.

Phase change in the phase-change materials may be induced reversibly. In this way, the memory may change from the amorphous state to the crystalline state, and from the crystalline state to the amorphous state, in response to temperature changes. The temperature changes to the phase-change material may be achieved in a variety of ways. For example, a laser can be directed to the phase-change material, current may be driven through the phase-change material, or current can be fed through a resistive heater adjacent the phase-change material. With any of these methods, controllable heating of the phase-change material causes controllable phase change within the phase-change material.

When a phase-change memory comprises a memory array having a plurality of memory cells that are made of phase-change material, the memory may be programmed to store data utilizing the memory states of the phase-change material. One way to read and write data in such a phase-change memory device is to control a current and/or a voltage pulse that is applied to the phase-change material. The level of current and voltage generally corresponds to the temperature induced within the phase-change material in each memory cell.

SUMMARY

One embodiment of the present invention provides a memory cell. The memory cell includes a first electrode, a second electrode, and a first portion of phase-change material contacting the first electrode. The memory cell includes a second portion of phase-change material contacting the second electrode and a third portion of phase-change material between the first portion and the second portion. A phase-change material composition of the third portion and the second portion gradually transitions from the third portion to the second portion.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
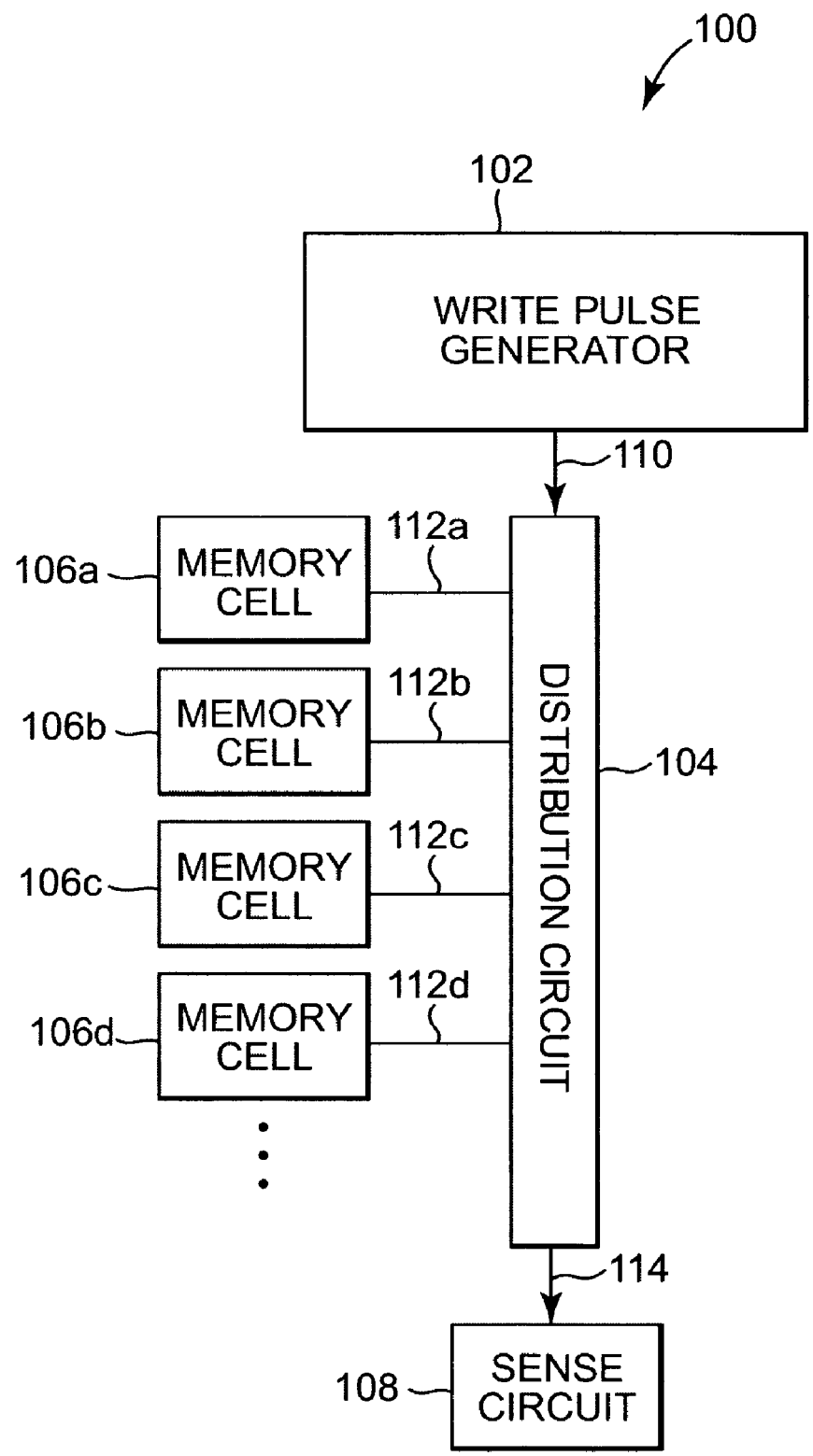
FIG. 1 illustrates a block diagram of one embodiment of a memory device.

FIG. 1 illustrates a block diagram of one embodiment of a memory device 100. Memory device 100 includes a write pulse generator 102, a distribution circuit 104, memory cells 106a, 106b, 106c, and 106d, and a sense circuit 108. In one embodiment, memory cells 106a-106d are phase-change memory cells that are based on the amorphous to crystalline phase transition of the memory material. Write pulse generator 102 is electrically coupled to distribution circuit 104 through signal path 110. Distribution circuit 104 is electrically coupled to memory cells 106a-106d through signal paths 112a-112d, respectively, and to sense circuit 108 through signal path 114.

Each phase-change memory cell 106a-106d includes phase-change material providing a storage location. The phase-change material of each phase-change memory cell includes three phase-change material portions. The composition of the phase-change material varies between adjacent phase-change material portions. The first phase-change material portion includes a first phase-change material composition and contacts a first electrode of the phase-change memory cell. The second phase-change material portion includes a second phase-change material composition and contacts a second electrode of the phase-change memory cell. The third phase-change material portion includes a third phase-change material composition and is between the first phase-change material portion and the second phase-change material portion.

The first phase-change material portion thermally insulates the first electrode, and the second phase-change material portion thermally insulates the second electrode. In one embodiment, the first phase-change material portion and the second phase-change material portion include the same phase-change material composition. In other embodiments, the first phase-change material portion and the second phase-change material portion include different phase-change material compositions. The third phase-change material portion, which is thermally insulated by the first phase-change material portion and the second phase-change material portion, provides the active region for the phase-change memory cell. The active region for the phase-change memory cell is where the phase-change material transitions between the crystalline state and the amorphous state for storing one bit, 1.5 bits, two bits, or several bits of data.

In one embodiment, write pulse generator 102 generates current or voltage pulses that are controllably directed to memory cells 106a-106d via distribution circuit 104. In one embodiment, distribution circuit 104 includes a plurality of transistors that controllably direct current or voltage pulses to the memory cells.

In one embodiment, memory cells 106a-106d are made of a phase-change material that may be changed from an amorphous state to a crystalline state or from a crystalline state to an amorphous state under influence of temperature change. The degree of crystallinity thereby defines at least two memory states for storing data within memory device 100. The at least two memory states can be assigned to the bit values "0" and "1". The bit states of memory cells 106a-106d differ significantly in their electrical resistivity. In the amorphous state, a phase-change material exhibits significantly higher resistivity than in the crystalline state. In this way, sense amplifier 108 reads the cell resistance such that the bit value assigned to a particular memory cell 106a-106d is determined.

To program a memory cell 106a-106d within memory device 100, write pulse generator 102 generates a current or voltage pulse for heating the phase-change material in the target memory cell. In one embodiment, write pulse generator 102 generates an appropriate current or voltage pulse, which is fed into distribution circuit 104 and distributed to the appropriate target memory cell 106a-106d. The current or voltage pulse amplitude and duration is controlled depending on whether the memory cell is being set or reset. Generally, a "set" operation of a memory cell is heating the phase-change material of the target memory cell above its crystallization temperature (but below its melting temperature) long enough to achieve the crystalline state. Generally, a "reset" operation of a memory cell is heating the phase-change material of the target memory cell above its melting temperature, and then quickly quench cooling the material, thereby achieving the amorphous state.

Figure 2:
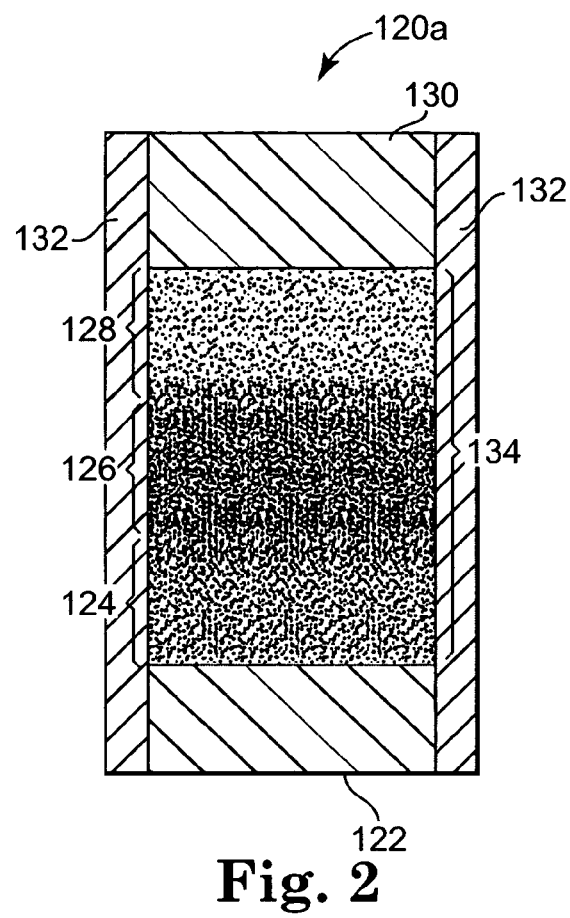
FIG. 2 illustrates a cross-sectional view of one embodiment of a phase-change memory cell.

FIG. 2 illustrates a cross-sectional view of one embodiment of a phase-change memory cell 120a. Phase-change memory cell 120a includes a first electrode 122, phase-change material 134, a second electrode 130, and insulation material 132. Phase-change material 134 provides a storage location for storing one bit, 1.5 bits, two bits, or several bits of data. Phase-change material 134 is laterally completely enclosed by insulation material 132, which defines the current path and hence the location of the phase change region in phase-change material 134. In one embodiment, each of the memory cells 106a-106d is similar to phase-change memory cell 120a.

First electrode 122 is TiN, TaN, W, Al, Cu, TiSiN, TaSiN, or another suitable electrode material. Second electrode 130 is TiN, TaN, W, Al, Cu, TiSiN, TaSiN, or another suitable electrode material. Insulation material 132 is $SiO_2$, fluorinated silica glass (FSG), doped boro-phosphorous silicate glass (BPSG), porous oxide, low-k dielectric, or another suitable dielectric material.

Phase-change material 134 may be made up of a variety of materials in accordance with the present invention. Generally, chalcogenide alloys that contain one or more elements from group VI of the periodic table are useful as such materials. In one embodiment, phase-change material 134 of memory cell 120a is made up of a chalcogenide compound material, such as GeSbTe, SbTe, GeTe, or AgInSbTe. In another embodiment, the phase-change material can be chalcogen free, such as GeSb, GaSb, InSb, or GeGaInSb. In other embodiments, the phase-change material can be made up of any suitable material including one or more of the elements Ge, Sb, Te, Ga, As, In, Se, and S. Phase-change material 134 may be selectively doped with nitrogen, oxygen, silicon, or another suitable material to modify the thermal conductivity, resistivity, and/or melting temperature of different portions of the phase-change material.

Phase-change material 134 includes a first portion 124 in contact with first electrode 122, a second portion 128 in contact with second electrode 130, and a third portion 126 between first portion 124 and second portion 128. First portion 124 of phase-change material 134 includes a first phase-change material composition. Second portion 128 of phase-change material 134 includes a second phase-change material composition, and third portion 126 of phase-change material 134 includes a third phase-change material composition. The first phase-change material composition gradually transitions to the third phase-change material composition, and the third phase-change material composition gradually transitions to the second phase-change material composition. In one embodiment, the phase-change material composition of first portion 124 includes the same phase-change material composition as second portion 128. In other embodiments, the phase-change material composition of first portion 124 is different from the phase-change material composition of second portion 128.

In one embodiment, phase-change material 134 is transitioned from the first phase-change material composition to the third phase-change material composition and from the third phase-change material composition to the second phase-change material composition by varying a doping level while depositing phase-change material 134. For example, phase-change material 134 can comprise GeSbTe. While depositing the GeSbTe, a nitrogen flow, an oxygen flow, or another suitable dopant flow is gradually increased to transition the phase-change material composition of first portion 124 from undoped GeSbTe contacting first electrode 122 to a doped GeSbTe of third portion 126. The doping level varies continuously from first portion 124 to second portion 128. At the center of third portion 126, the doping level is gradually decreased to transition the doped GeSbTe of third portion 126 to undoped GeSbTe of second portion 128 contacting second electrode 130.

First portion 124 and second portion 128 of phase-change material 134 have a lower resistivity and preferably have a lower thermal conductivity and a higher melting temperature than third portion 126 of phase-change material 134 due to the doping level. Therefore, first portion 124 and second portion 128 thermally insulate first electrode 122 and second electrode 130, respectively, such that the active phase-change region is confined to third portion 126. By adjusting the doping level, the size of first portion 124, second portion 128, and third portion 126 can be adjusted to achieve a desired size for the active region. Also, by adjusting the doping levels within each portion 124, 126, and 128 of phase-change material 134, phase-change memory cell 120a can be optimized for multi-bit data storage.

During operation of phase-change memory cell 120a, a write pulse is applied between first electrode 122 and second electrode 130 to program phase-change memory cell 120a.

Since first portion 124 and second portion 128 of phase-change material 134 insulate third portion 126 of phase-change material 134, the highest temperature within phase-change material 134 during a write pulse is within third portion 126. In addition, due to the higher resistivity of third portion 126, more heat is generated within third portion 126 than within first portion 124 and second portion 128.

During a set operation of phase-change memory cell 120a, a set current or voltage pulse is selectively enabled to the selection device and sent through first electrode 122 to phase-change material 134 thereby heating third portion 126 of phase-change material 134 above its crystallization temperature (but usually below its melting temperature). In this way, third portion 126 of phase-change material 134 reaches its crystalline state during this set operation. During a reset operation of phase-change memory cell 120a, a reset current or voltage pulse is selectively enabled to the selection device and sent through first electrode 122 to phase-change material 134. The reset current or voltage quickly heats third portion 126 of phase-change material 134 above its melting temperature. After the current or voltage pulse is turned off, third portion 126 of phase-change material 134 quickly quench cools into the amorphous state.

Figure 3:
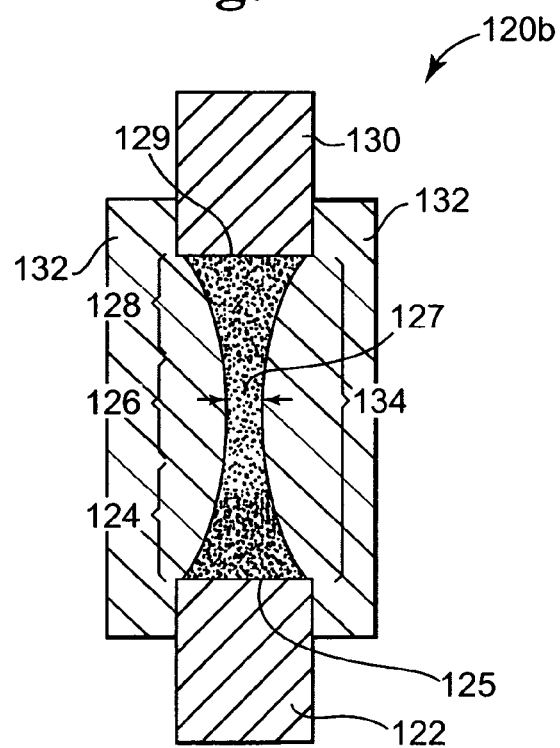
FIG. 3 illustrates a cross-sectional view of another embodiment of a phase-change memory cell.

FIG. 3 illustrates a cross-sectional view of another embodiment of a phase-change memory cell 120b. In one embodiment, phase-change memory cell 120b is a pillar phase-change memory cell. Phase-change memory cell 120b includes first electrode 122, phase-change material 134, second electrode 130, and insulation material 132. Phase-change material 134 provides a storage location for storing one bit, 1.5 bits, two bits, or several bits of data. Phase-change material 134 is laterally completely enclosed by insulation material 132, which defines the current path and hence the location of the phase change region in phase-change material 134. In one embodiment, each of the memory cells 106a-106d is similar to phase-change memory cell 120b.

Phase-change material 134 includes a first portion 124 in contact with first electrode 122 at 125, a second portion 128 in contact with second electrode 130 at 129, and a third portion 126 between first portion 124 and second portion 128. First portion 124 of phase-change material 134 has a maximum width or cross-section at 125, second portion 128 of phase-change material 134 has a maximum width or cross-section at 129, and third portion 126 of phase-change material 134 has a minimum width or cross-section at 127. The maximum width at 125 of first portion 124 and the maximum width at 129 of second portion 128 are greater than the minimum width at 127 of third portion 126.

In one embodiment, a maximum width of third portion 126 is less than a minimum width of first portion 124 and a minimum width of second portion 128. In another embodiment, a maximum width of third portion 126 is less than a maximum width of first portion 124 and a maximum width of second portion 128. In another embodiment, a minimum width of third portion 126 is less than a minimum width of first portion 124 and a minimum width of second portion 128. In one embodiment, the maximum width at 125 of first portion 124 is approximately equal to the maximum width at 129 of second portion 128. In other embodiments, the maximum width at 125 of first portion 124 is different than the maximum width at 129 of second portion 128. In one embodiment, phase-change material 134 forms an hourglass shape.

Portions 124, 126, and 128 of phase-change material 134 of phase-change memory cell 120b have similar phase-change material compositions and functions as the corresponding portions 124, 126, and 128 of phase-change memory cell 120a previously described and illustrated with reference to FIG. 2. Phase-change memory cell 120b operates similarly to phase-change memory cell 120a.

Figure 4:
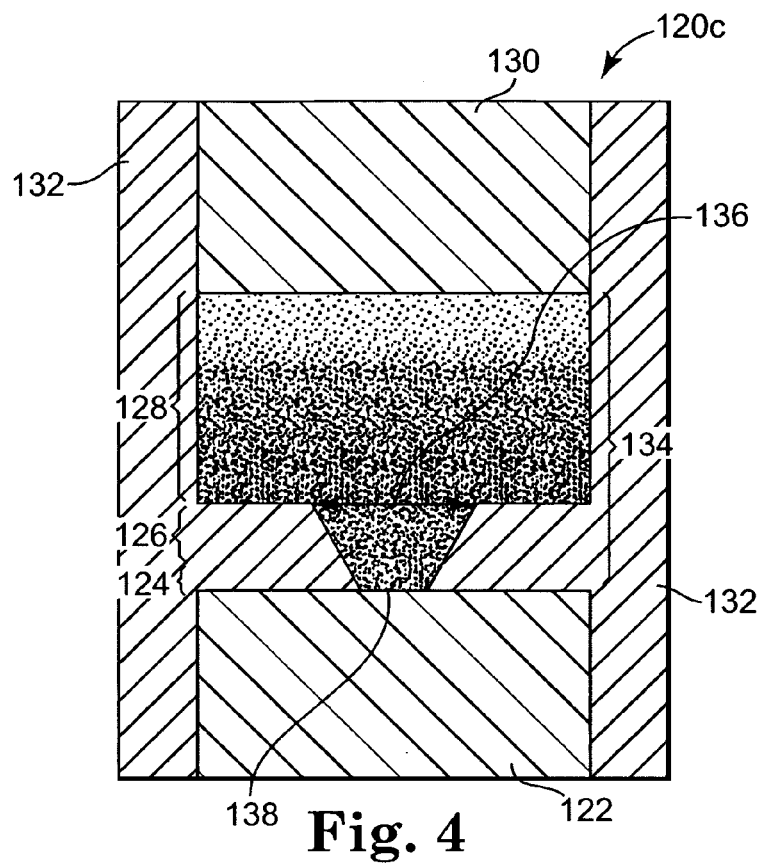
FIG. 4 illustrates a cross-sectional view of another embodiment of a phase-change memory cell.

FIG. 4 illustrates a cross-sectional view of another embodiment of a phase-change memory cell 120c. In one embodiment, phase-change memory cell 120c is a tapered via phase-change memory cell. Phase-change memory cell 120c includes first electrode 122, phase-change material 134, second electrode 130, and insulation material 132. Phase-change material 134 provides a storage location for storing one bit, 1.5 bits, two bits, or several bits of data. Phase-change material 134 is laterally completely enclosed by insulation material 132, which defines the current path and hence the location of the phase change region in phase-change material 134. In one embodiment, each of the memory cells 106a-106d is similar to phase-change memory cell 120c.

Phase-change material 134 includes a first portion 124 in contact with first electrode 122 at 138, a second portion 128 in contact with second electrode 130, and a third portion 126 between first portion 124 and second portion 128. First portion 124 and third portion 126 of phase-change material 134 have tapered sidewalls and has a maximum width or cross-section at 136 and a minimum width or cross-section at 138. In other embodiments, first portion 124 and third portion 126 may extend up the sides of second portion 128 due to sidewall covering during the deposition of first portion 124 and third portion 126 of phase-change material 134.

Portions 124, 126, and 128 of phase-change material 134 of phase-change memory cell 120c have similar phase-change material compositions and functions as the corresponding portions 124, 126, and 128 of phase-change memory cell 120a previously described and illustrated with reference to FIG. 2. Phase-change memory cell 120c operates similarly to phase-change memory cell 120a.

Figure 5:
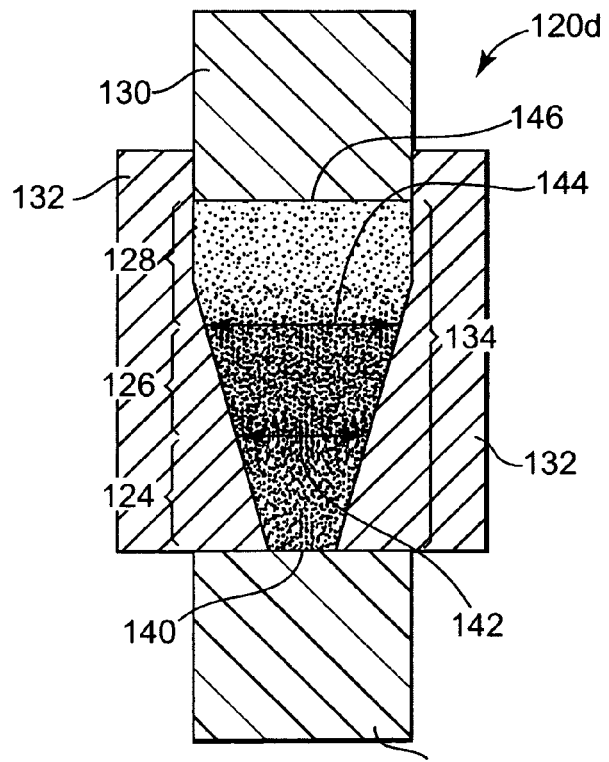
FIG. 5 illustrates a cross-sectional view of another embodiment of a phase-change memory cell.

FIG. 5 illustrates a cross-sectional view of another embodiment of a phase-change memory cell 120d. In one embodiment, phase-change memory cell 120d is a tapered via phase-change memory cell. Phase-change memory cell 120d includes first electrode 122, phase-change material 134, second electrode 130, and insulation material 132. Phase-change material 134 provides a storage location for storing one bit, 1.5 bits, two bits, or several bits of data. Phase-change material 134 is laterally completely enclosed by insulation material 132, which defines the current path and hence the location of the phase-change region in phase-change material 134. In one embodiment, each of the memory cells 106a-106d is similar to phase-change memory cell 120d.

Phase-change material 134 includes a first portion 124 in contact with first electrode 122 at 140, a second portion 128 in contact with second electrode 130 at 146, and a third portion 126 between first portion 124 and second portion 128. First portion 124 of phase-change material 134 has a maximum width or cross-section at 142 and a minimum width or cross-section at 140. Second portion 128 of phase-change material 134 has a maximum width or cross-section at 146 and a minimum width or cross-section at 144. Third portion 126 of phase-change material 134 has a maximum width or cross-section at 144 and a minimum width or cross-section at 142. In other embodiments, first portion 124 and third portion 126 may extend up the sides of second portion 128 due to sidewall covering during the deposition of first portion 124 and third portion 126 of phase-change material 134.

In one embodiment, a minimum width of first portion 124 is less than a minimum width of third portion 126. In another embodiment, a maximum width of first portion 124 is less than a minimum width of third portion 126. In another embodiment, a maximum width of first portion 124 is less than a maximum width of third portion 126. In one embodiment, a minimum width of third portion 126 is less than a minimum width of second portion 128. In another embodiment, a maximum width of third portion 126 is less than a minimum width of second portion 128. In another embodiment, a maximum width of third portion 126 is less than a maximum width of second portion 128. In one embodiment, phase-change material 134 has tapered sidewalls.

Portions 124, 126, and 128 of phase-change material 134 of phase-change memory cell 120d have similar phase-change material compositions and functions as the corresponding portions 124, 126, and 128 of phase-change memory cell 120a previously described and illustrated with reference to FIG. 2. Phase-change memory cell 120d operates similarly to phase-change memory cell 120a.

Figure 6:
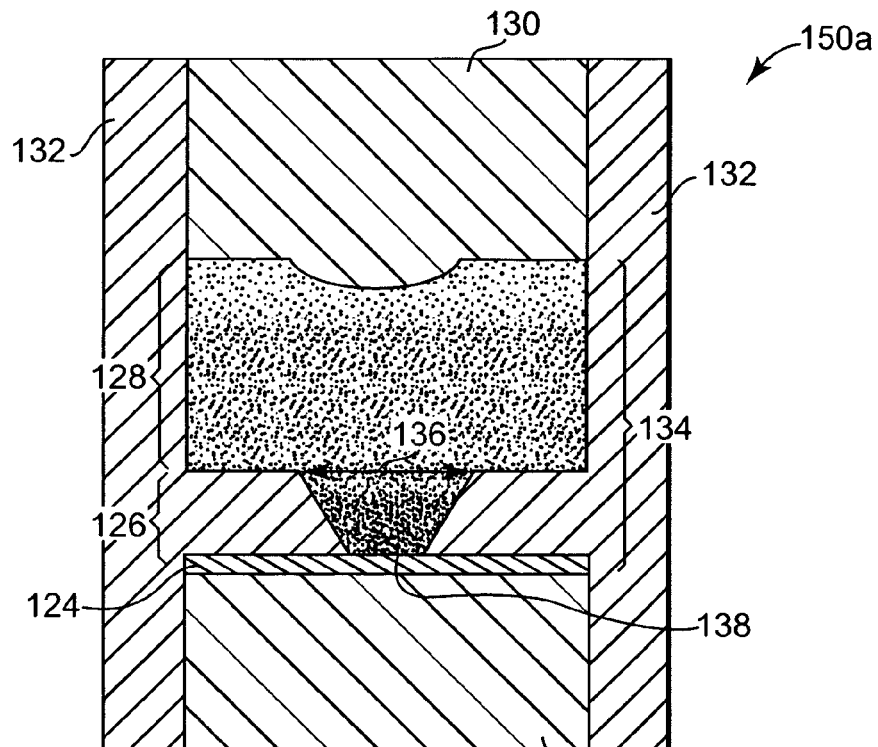
FIG. 6 illustrates a cross-sectional view of another embodiment of a phase-change memory cell.

FIG. 6 illustrates a cross-sectional view of another embodiment of a phase-change memory cell 150a. In one embodiment, phase-change memory cell 150a is a tapered via phase-change memory cell. Phase-change memory cell 150a includes first electrode 122, phase-change material 134, second electrode 130, and insulation material 132. Phase-change material 134 provides a storage location for storing one bit, 1.5 bits, two bits, or several bits of data. Phase-change material 134 is laterally completely enclosed by insulation material 132, which defines the current path and hence the location of the phase change region in phase-change material 134. In one embodiment, each of the memory cells 106a-106d is similar to phase-change memory cell 150a.

Phase-change material 134 includes a first portion 124 in contact with first electrode 122, a second portion 128 in contact with second electrode 130, and a third portion 126 contacting first portion 124 at 138 and second portion 128. First portion 124 of phase-change material 134 has a width or cross-section equal to the width or cross-section of first electrode 122. Third portion 126 of phase-change material 134 has tapered sidewalls and has a maximum width or cross-section at 136 and a minimum width or cross-section at 138. In other embodiments, third portion 126 may extend up the sides of second portion 128 due to sidewall covering during the deposition of third portion 126 of phase-change material 134.

First portion 124 of phase-change material 134 includes a first phase-change material composition. Second portion 128 of phase-change material 134 includes a second phase-change material composition, and third portion 126 of phase-change material 134 includes a third phase-change material composition. The first phase-change material composition is constant, and the third phase-change material composition gradually transitions to the second phase-change material composition. In one embodiment, the phase-change material composition of first portion 124 includes the same phase-change material composition as second portion 128. In other embodiments, the phase-change material composition of first portion 124 is different from the phase-change material composition of second portion 128.

In one embodiment, phase-change material 134 is transitioned from the third phase-change material composition to the second phase-change material composition by varying a doping level while depositing phase-change material 134. For example, phase-change material 134 can comprise GeSbTe. While depositing the GeSbTe, a nitrogen flow, an oxygen flow, or another suitable dopant flow is gradually decreased to transition the phase-change material composition of third portion 126 from doped GeSbTe contacting first portion 124 at 138 to undoped GeSbTe of second portion 128. The doping level varies continuously from third portion 126 to second portion 128, such that undoped GeSbTe of second portion 128 contacts second electrode 130.

First portion 124 and second portion 128 of phase-change material 134 have a lower resistivity and preferably have a lower thermal conductivity and a higher melting temperature than third portion 126 of phase-change material 134 due to the doping level. Therefore, first portion 124 and second portion 128 thermally insulate first electrode 122 and second electrode 130, respectively, such that the active phase-change region is confined to third portion 126. By adjusting the doping level, the size of second portion 128 and third portion 126 can be adjusted to achieve a desired size for the active region. Also, by adjusting the doping levels within each portion 126 and 128, phase-change memory cell 150a can be optimized for multi-bit data storage.

During operation of phase-change memory cell 150a, a write pulse is applied between first electrode 122 and second electrode 130 to program phase-change memory cell 150a. Since first portion 124 and second portion 128 of phase-change material 134 have a lower thermal conductivity than third portion 126 of phase-change material 134, the highest temperature within phase-change material 134 during a write pulse is within third portion 126. Phase-change memory cell 150a operates similarly to phase-change memory cell 120a.

Figure 7:
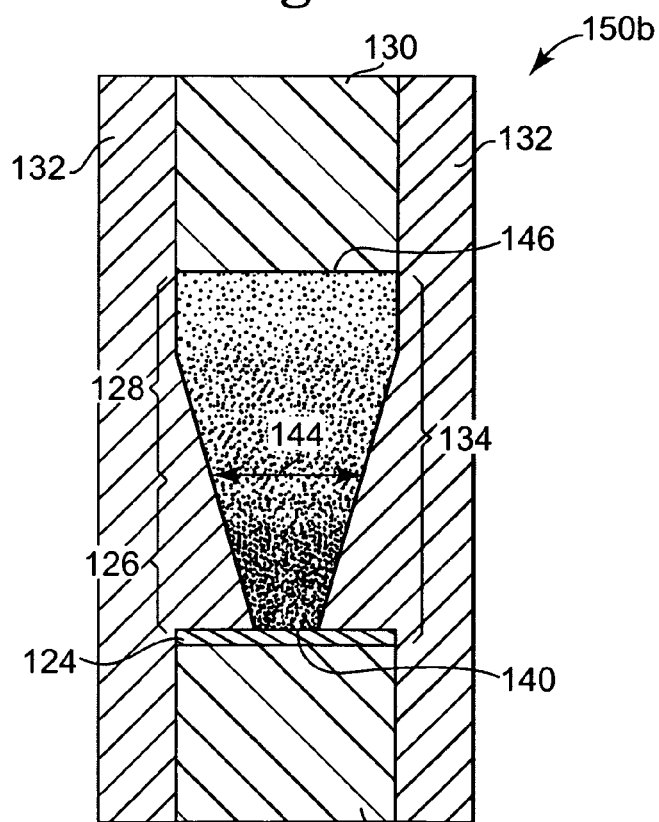
FIG. 7 illustrates a cross-sectional view of another embodiment of a phase-change memory cell.

FIG. 7 illustrates a cross-sectional view of another embodiment of a phase-change memory cell 150b. In one embodiment, phase-change memory cell 150b is a tapered via phase-change memory cell. Phase-change memory cell 150b includes first electrode 122, phase-change material 134, second electrode 130, and insulation material 132. Phase-change material 134 provides a storage location for storing one bit, 1.5 bits, two bits, or several bits of data. Phase-change material 134 is laterally completely enclosed by insulation material 132, which defines the current path and hence the location of the phase-change region in phase-change material 134. In one embodiment, each of the memory cells 106a-106d is similar to phase-change memory cell 150b.

Phase-change material 134 includes a first portion 124 in contact with first electrode 122, a second portion 128 in contact with second electrode 130 at 146, and a third portion 126 contacting first portion 124 at 140 and second portion 128. First portion 124 of phase-change material 134 has the same width or cross-section as first electrode 122. Second portion 128 of phase-change material 134 has a maximum width or cross-section at 146 and a minimum width or cross-section at 144. Third portion 126 of phase-change material 134 has a maximum width or cross-section at 144 and a minimum width or cross-section at 140. In other embodiments, third portion 126 may extend up the sides of second portion 128 due to sidewall covering during the deposition of third portion 126 of phase-change material 134.

In one embodiment, a minimum width of third portion 126 is less than a minimum width of second portion 128. In another embodiment, a maximum width of third portion 126 is less than a minimum width of second portion 128. In another embodiment, a maximum width of third portion 126 is less than a maximum width of second portion 128. In one embodiment, second portion 128 and third portion 126 of phase-change material 134 have tapered sidewalls.

Portions 124, 126, and 128 of phase-change material 134 of phase-change memory cell 150b have similar phase-change material compositions and functions as the corresponding portions 124, 126, and 128 of phase-change memory cell 150a previously described and illustrated with reference to FIG. 6. Phase-change memory cell 150b operates similarly to phase-change memory cell 120a.

Figure 8:
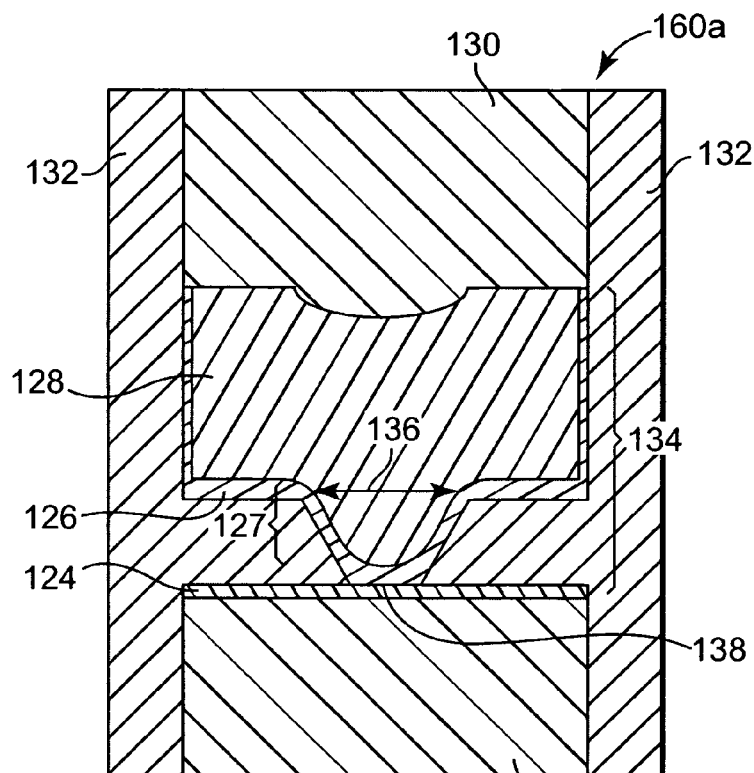
FIG. 8 illustrates a cross-sectional view of another embodiment of a phase-change memory cell.

FIG. 8 illustrates a cross-sectional view of another embodiment of a phase-change memory cell 160a. In one embodiment, phase-change memory cell 160a is a tapered via phase-change memory cell. Phase-change memory cell 160a includes first electrode 122, phase-change material 134, second electrode 130, and insulation material 132. Phase-change material 134 provides a storage location for storing one bit, 1.5 bits, two bits, or several bits of data. Phase-change material 134 is laterally completely enclosed by insulation material 132, which defines the current path and hence the location of the phase change region in phase-change material 134. In one embodiment, each of the memory cells 106a-106d is similar to phase-change memory cell 160a.

Phase-change material 134 includes a first portion 124 in contact with first electrode 122, a second portion 128 in contact with second electrode 130, and a third portion 126 contacting first portion 124 at 138 and second portion 128. First portion 124 of phase-change material 134 has a width or cross-section equal to the width or cross-section of first electrode 122. Third portion 126 of phase-change material 134 laterally completely surrounds second portion 128 of phase-change material 134. The lower part 127 of second portion 128 of phase-change material 134 has tapered sidewalls and has a maximum width or cross-section at 136 and a minimum width or cross-section near 138.

First portion 124 of phase-change material 134 includes a first phase-change material composition. Second portion 128 of phase-change material 134 includes a second phase-change material composition, and third portion 126 of phase-change material 134 includes a third phase-change material composition. The first, second, and third phase-change material compositions are constant. In one embodiment, the phase-change material composition of first portion 124 includes the same phase-change material composition as second portion 128. In other embodiments, the phase-change material composition of first portion 124 is different from the phase-change material composition of second portion 128.

First portion 124 and second portion 128 of phase-change material 134 have a lower resistivity and preferably have a lower thermal conductivity and a higher melting temperature than third portion 126 of phase-change material 134 due to the phase-change materials selected. Therefore, first portion 124 and second portion 128 thermally insulate first electrode 122 and second electrode 130, respectively, such that the active phase-change region is confined to third portion 126. In particular, the active phase-change region is confined to the phase-change material between first portion 124 at 138 and the lower part 127 of second portion 128. By adjusting the amount of phase-change material deposited for third portion 126, the size of second portion 128 and third portion 126 can be adjusted to achieve a desired size for the active region. Also, by adjusting the amount and type of phase-change material deposited for third portion 126, phase-change memory cell 160a can be optimized for multi-bit data storage.

During operation of phase-change memory cell 160a, a write pulse is applied between first electrode 122 and second electrode 130 to program phase-change memory cell 160a. Since first portion 124 and second portion 128 of phase-change material 134 insulate third portion 126 of phase-change material 134, the highest temperature within phase-change material 134 during a write pulse is within third portion 126. In addition, due to the higher resistivity of third portion 126, more heat is generated within third portion 126 than within first portion 124 and second portion 128. Phase-change memory cell 160a operates similarly to phase-change memory cell 120a.

Figure 9:
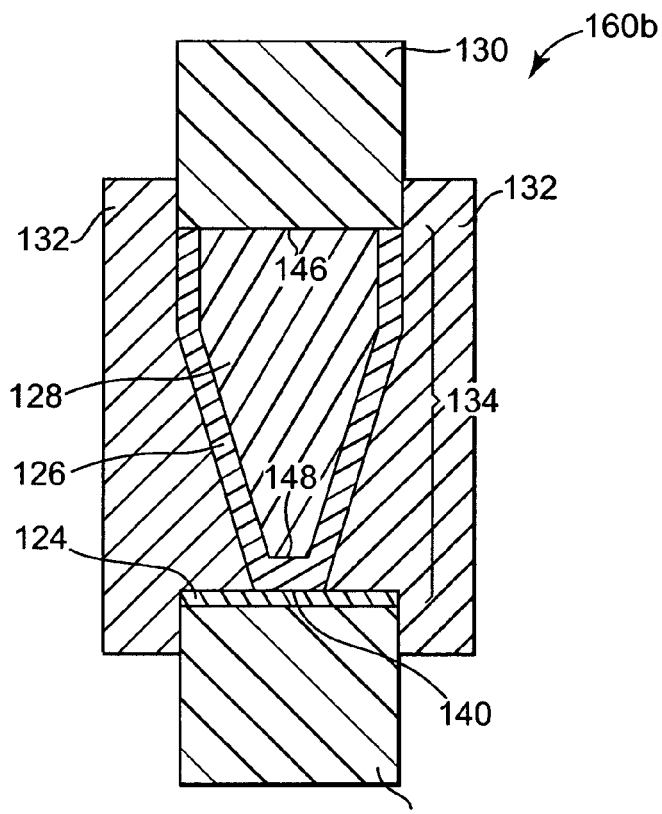
FIG. 9 illustrates a cross-sectional view of another embodiment of a phase-change memory cell.

FIG. 9 illustrates a cross-sectional view of another embodiment of a phase-change memory cell 160b. In one embodiment, phase-change memory cell 160b is a tapered via phase-change memory cell. Phase-change memory cell 160b includes first electrode 122, phase-change material 134, second electrode 130, and insulation material 132. Phase-change material 134 provides a storage location for storing one bit, 1.5 bits, two bits, or several bits of data. Phase-change material 134 is laterally completely enclosed by insulation material 132, which defines the current path and hence the location of the phase change region in phase-change material 134. In one embodiment, each of the memory cells 106a-106d is similar to phase-change memory cell 160b.

Phase-change material 134 includes a first portion 124 in contact with first electrode 122, a second portion 128 in contact with second electrode 130 at 146, and a third portion 126 contacting first portion 124 at 140 and second portion 128. First portion 124 of phase-change material 134 has the same width or cross-section as first electrode 122. Second portion 128 of phase-change material 134 has a maximum width or cross-section at 146 and a minimum width or cross-section at 148. Third portion 126 of phase-change material 134 laterally completely surrounds second portion 128 of phase-change material 134. In one embodiment, second portion 128 of phase-change material 134 has tapered sidewalls.

Portions 124, 126, and 128 of phase-change material 134 of phase-change memory cell 160b have similar phase-change material compositions and functions as the corresponding portions 124, 126, and 128 of phase-change memory cell 160a previously described and illustrated with reference to FIG. 8. Phase-change memory cell 160b operates similarly to phase-change memory cell 120a.

Figure 10:
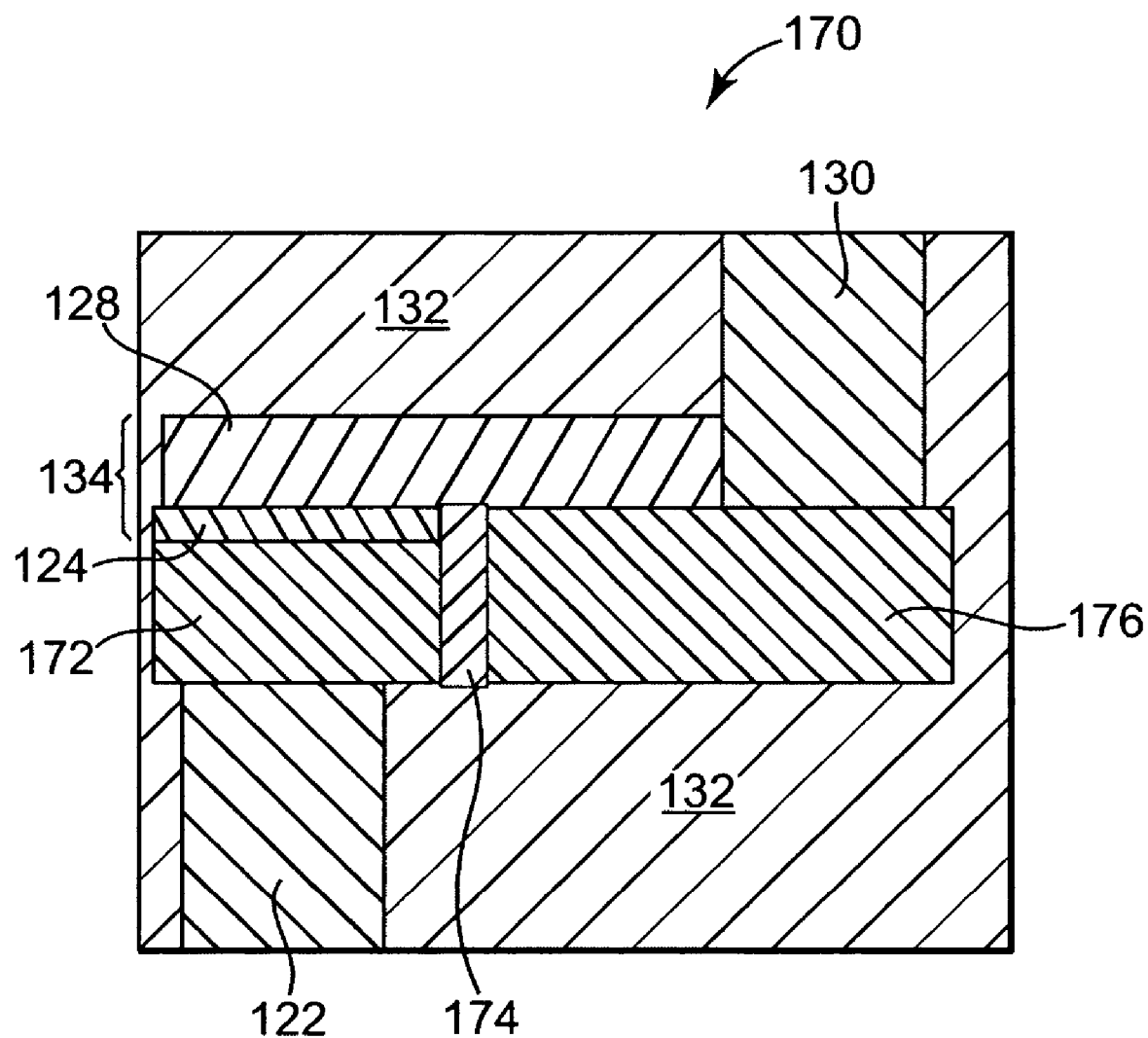
FIG. 10 illustrates a cross-sectional view of another embodiment of a phase-change memory cell.

FIG. 10 illustrates a cross-sectional view of another embodiment of a phase-change memory cell 170. In one embodiment, phase-change memory cell 170 is a bridge phase-change memory cell. Phase-change memory cell 170 includes first electrode 122, a first contact 172, phase-change material 134, a second contact 176, a spacer 174, second electrode 130, and dielectric material 132. Phase-change material 134 provides a storage location for storing one bit, 1.5 bits, two bits, or several bits of data.

Phase-change material 134 includes a first portion 124 in contact with first contact 172 and a second portion 128 in contact with second contact 176 separated by spacer 174. First contact 172 contacts first electrode 122 and second contact 176 contacts second electrode 130. First portion 124 of phase-change material 134 includes a first phase-change material composition. Second portion 128 of phase-change material 134 includes a second phase-change material composition.

First portion 124 of phase-change material 134 has a lower resistivity and preferably has a lower thermal conductivity and a higher melting temperature than second portion 128 of phase-change material 134 due to the phase-change materials selected. Therefore, first portion 124 thermally insulates first contact 172, such that the active phase-change region is confined to second portion 128. By adjusting the amount and type of phase-change material deposited for second portion 128, phase-change memory cell 170 can be optimized for multi-bit data storage.

During operation of phase-change memory cell 170, a write pulse is applied between first contact 171 and second contact 176 to program phase-change memory cell 170. Since first portion 124 insulates second portion 128 of phase-change material 134, the highest temperature within phase-change material 134 during a write pulse is within second portion 128. In addition, due to the higher resistivity of second portion 128, more heat is generated within second portion 128 than within first portion 124. Phase-change memory cell 170 operates similarly to phase-change memory cell 120a.

Embodiments of the present invention provide a phase-change memory cell including phase-change material having three portions. The first portion of the phase-change material insulates the first electrode, and the second portion of the phase-change material insulates the second electrode. The third portion of the phase-change material, which is insulated by the first portion and the third portion, is the active region. By controlling the volume of the active region and thermally insulating the active region, the reset current of the phase-change memory cell can be reduced. In addition, control of multi-bit data storage within the phase-change memory cell can be improved.

What is claimed is:

1. A memory cell comprising:
   a first electrode;
   a second electrode;
   a first portion of phase-change material contacting the first electrode;
   a second portion of phase-change material contacting the second electrode; and
   a third portion of phase-change material between the first portion and the second portion,
   wherein a phase-change material composition of the third portion and the second portion gradually transitions from the third portion to the second portion, and
   wherein the first portion has a first melting temperature, the second portion has a second melting temperature, and the third portion has a third melting temperature less than the first melting temperature and the second melting temperature.

2. A memory cell comprising:
   a first electrode;
   a second electrode;
   a first portion of phase-change material contacting the first electrode;
   a second portion of phase-change material contacting the second electrode; and
   a third portion of phase-change material between the first portion and the second portion,
   wherein a phase-change material composition of the third portion and the second portion gradually transitions from the third portion to the second portion,
   wherein the phase-change material composition of the third portion and the second portion gradually transitions from the third portion comprising a doped phase-change material to the second portion comprising a differently doped or undoped phase-change material.

3. A memory cell comprising:
   a first electrode;
   a second electrode;
   a first portion of phase-change material contacting the first electrode, the first portion comprising a first phase-change material;
   a second portion of phase-change material contacting the second electrode, the second portion comprising a second phase-change material; and
   a third portion of phase-change material contacting the first portion and the second portion and laterally surrounding the second portion, the third portion comprising a third phase-change material different than the first phase-change material and the second phase-change material.

4. The memory cell of claim 3, wherein the first portion has a first resistivity, the second portion has a second resistivity, and the third portion has a third resistivity greater than the first resistivity and the second resistivity.

5. The memory cell of claim 3, wherein the first portion has a first melting temperature, the second portion has a second melting temperature, and the third portion has a third melting temperature less than the first melting temperature and the second melting temperature.

6. The memory cell of claim 3, wherein the third portion comprises a doped phase-change material and the first portion and the second portion comprise a differently doped or undoped phase-change material.

7. The memory cell of claim 3, wherein the first portion, the second portion, and the third portion each comprises at least one of Ge, Sb, Te, Ga, As, In, Se, and S.

8. A memory cell comprising:
   a first electrode;
   a first contact contacting the first electrode;
   a second electrode;
   a second contact contacting the second electrode;
   a first portion of phase-change material contacting the first contact, the first portion having a first phase-change material composition; and
   a second portion of phase-change material contacting the first portion and the second contact, the second portion having a second phase-change material composition different than the first phase-change material composition,
   wherein the first portion has a first melting temperature and the second portion has a second melting temperature less than the first melting temperature.

9. The memory cell of claim 8, wherein the first portion has a first resistivity and the second portion has a second resistivity greater than the first resistivity.

10. The memory cell of claim 8, wherein the first portion and the second portion each comprises at least one of Ge, Sb, Te, Ga, As, In, Se, and S.

11. A memory cell comprising:
    a first electrode;
    a second electrode;
    a first portion of phase-change material contacting the first electrode;
    a second portion of phase-change material contacting the second electrode; and
    a third portion of phase-change material between the first portion and the second portion,
    wherein a phase-change material composition of the third portion and the second portion gradually transitions from the third portion comprising a doped phase-change material to the second portion comprising a differently doped or undoped phase-change material.

12. The memory cell of claim 11, wherein a phase-change material composition of the first portion and the third portion gradually transitions from the first portion comprising a differently doped or undoped phase-change material to the third portion.

13. The memory cell of claim 11, wherein the first portion has a first resistivity, the second portion has a second resistivity, and the third portion has a third resistivity greater than the first resistivity and the second resistivity.

14. The memory cell of claim 11, wherein the first portion has a first melting temperature, the second portion has a second melting temperature, and the third portion has a third melting temperature less than the first melting temperature and the second melting temperature.

15. The memory cell of claim 11, wherein the first portion, the second portion, and the third portion each comprises at least one of Ge, Sb, Te, Ga, As, In, Se, and S.

16. A memory cell comprising:
   a first electrode;
   a second electrode;
   a first portion of phase-change material contacting the first electrode, the first portion of phase-change material comprising a first phase-change material composition;
   a second portion of phase-change material contacting the second electrode, the second portion of phase-change material comprising a second phase-change material composition; and
   a third portion of phase-change material contacting the first portion and the second portion and laterally surrounding the second portion, the third portion of phase-change material comprising a third phase-change material composition different from the first phase-change material composition and the second phase-change material composition.

17. The memory cell of claim 16, wherein the first phase-change material composition has a first resistivity, the second phase-change material composition has a second resistivity, and the third phase-change material composition has a third resistivity greater than the first resistivity and the second resistivity.

18. The memory cell of claim 16, wherein the first phase-change material composition has a first melting temperature, the second phase-change material composition has a second melting temperature, and the third phase-change material composition has a third melting temperature less than the first melting temperature and the second melting temperature.

19. The memory cell of claim 16, wherein the third phase-change material composition comprises a doped phase-change material and the first phase-change material composition and the second phase-change material composition comprise a differently doped or undoped phase-change material.

20. The memory cell of claim 16, wherein the first phase-change material composition, the second phase-change material composition, and the third phase-change material composition each comprises at least one of Ge, Sb, Te, Ga, As, In, Se, and S.

* * * * *